United States Patent
Gu

(10) Patent No.: US 8,674,753 B2
(45) Date of Patent: Mar. 18, 2014

(54) SYSTEMS AND METHODS FOR CANCELLING PHASE-LOCKED LOOP SUPPLY NOISE

(75) Inventor: Richard Gu, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 996 days.

(21) Appl. No.: 12/131,982

(22) Filed: Jun. 3, 2008

(65) Prior Publication Data

US 2009/0295440 A1 Dec. 3, 2009

(51) Int. Cl.
- *H03B 1/00* (2006.01)
- *H03K 5/00* (2006.01)
- *H04B 1/10* (2006.01)

(52) U.S. Cl.
USPC ........... 327/551; 327/552; 327/553; 327/554; 327/555

(58) Field of Classification Search
USPC ................................ 327/551–559
See application file for complete search history.

(56) References Cited

U.S. PATENT DOCUMENTS

| | | | | |
|---|---|---|---|---|
| 5,489,873 A * | 2/1996 | Kamata et al. | | 327/558 |
| 5,847,606 A * | 12/1998 | Shacter | | 330/253 |
| 6,075,406 A * | 6/2000 | Lee et al. | | 327/538 |
| 6,150,872 A * | 11/2000 | McNeill et al. | | 327/539 |
| 6,157,180 A * | 12/2000 | Kuo | | 323/282 |
| 6,278,332 B1 * | 8/2001 | Nelson et al. | | 331/17 |
| 6,429,734 B1 * | 8/2002 | Wang et al. | | 327/558 |
| 6,671,863 B2 * | 12/2003 | Gauthier et al. | | 716/113 |
| 6,747,497 B2 * | 6/2004 | Ingino, Jr. | | 327/157 |
| 6,928,128 B1 * | 8/2005 | Sidiropoulos | | 375/376 |
| 7,038,538 B2 * | 5/2006 | Tran et al. | | 330/134 |
| 7,068,094 B1 * | 6/2006 | Jamal et al. | | 327/541 |
| 7,092,474 B2 * | 8/2006 | Cao | | 375/375 |
| 7,157,962 B2 * | 1/2007 | Gu | | 327/590 |
| 7,167,037 B2 * | 1/2007 | Rodgers et al. | | 327/384 |
| 7,511,582 B2 * | 3/2009 | Yin | | 331/36 C |
| 7,554,412 B2 * | 6/2009 | Kojima et al. | | 331/11 |
| 2003/0190005 A1 * | 10/2003 | Amick et al. | | 375/376 |
| 2004/0251974 A1 * | 12/2004 | Fukuda | | 331/17 |
| 2005/0237092 A1 * | 10/2005 | Kawago et al. | | 327/157 |
| 2006/0055451 A1 * | 3/2006 | Gu | | 327/536 |
| 2006/0273835 A1 * | 12/2006 | Rodgers et al. | | 327/157 |
| 2007/0200636 A1 * | 8/2007 | Cheruiyot et al. | | 331/16 |
| 2008/0136472 A1 * | 6/2008 | Shor | | 327/156 |
| 2008/0258765 A1 * | 10/2008 | Shumarayev et al. | | 326/41 |
| 2009/0122939 A1 * | 5/2009 | Hoang et al. | | 375/375 |
| 2009/0134923 A1 * | 5/2009 | Kwong et al. | | 327/157 |

* cited by examiner

*Primary Examiner* — Adam Houston
(74) *Attorney, Agent, or Firm* — Alan A. R. Cooper; W. James Brady, III; Frederick J. Telecky, Jr.

(57) ABSTRACT

One embodiment of an apparatus for cancelling supply noise includes an input circuit operable to receive an input from a charge pump and a drive circuit connected to an output of the input circuit. The drive circuit is operable to provide an output matching the input to the input circuit when a voltage source powering the input circuit and the drive circuit is stable, and to introduce a contrary voltage change on the buffered output when the voltage source is noisy, with the contrary voltage change being contrary to a voltage change on the voltage source due to noise.

14 Claims, 3 Drawing Sheets

SYSTEMS AND METHODS FOR CANCELLING PHASE-LOCKED LOOP SUPPLY NOISE

BACKGROUND

The present invention is related to cancelling supply noise in a phase-locked loop, and in particular to a charge pump buffer providing supply noise cancellation for a phase-locked loop.

Phase-locked loops (PLLs) are used to provide a clock signal that tracks the frequency and phase of an input reference frequency. Although various types of PLLs are available, one particular example uses a voltage controlled oscillator (VCO) to generate an output clock. The frequency of the output clock may be adjusted to match the input reference frequency or some multiple of the input reference frequency. A phase frequency detector in the PLL compares the input reference frequency with the output clock and, together with a charge pump in the PLL, generates a voltage that controls the frequency at which the VCO oscillates. In one particular type of VCO, the control voltage adjusts the capacitance in an LC tank circuit in the VCO. The LC tank circuit includes a voltage controlled capacitor and an inductor that alternately charge and discharge, and this oscillation generates the output clock. By adjusting the capacitance in the LC tank circuit, the time it takes to charge and discharge the LC tank circuit changes. For example, by decreasing the control voltage, the capacitance of the LC tank circuit increases and the frequency decreases. By increasing the control voltage, the capacitance of the LC tank circuit decreases and the frequency increases. Thus, if the phase frequency detector determines that the output clock from the VCO is slower than the reference frequency, the phase frequency detector will cause the charge pump to increase the control voltage to the VCO to increase the frequency of the output clock. If the phase frequency detector determines that the output clock from the VCO is faster than the reference frequency, the phase frequency detector will cause the charge pump to decrease the control voltage to the VCO to increase the frequency of the output clock.

This voltage control of the frequency in a PLL provides a simple and effective way to tune the PLL. However, voltage control renders the PLL susceptible to noise on the power supply. For example, if the supply voltage used to charge the LC tank circuit in the VCO changes rapidly due to noise, the time it takes to charge the LC tank circuit also changes and causes jitter in the output frequency from the PLL. In extreme cases, supply noise can even cause a PLL to lose its lock with the reference frequency.

Hence, for at least the aforementioned reasons, there exists a need in the art for systems and methods for cancelling phase-locked loop supply noise.

SUMMARY

The present invention is related to cancelling supply noise for circuits such as a phase-locked loop, and in particular to a charge pump buffer providing supply noise cancellation for a phase-locked loop.

In accordance with a preferred embodiment of the present invention, apparatuses for cancelling supply noise are provided. An apparatus for cancelling supply noise includes an input circuit operable to receive an input from a charge pump and a drive circuit coupled to an output of the input circuit. The drive circuit is operable to provide an output matching the input to the input circuit when a voltage source powering the input circuit and the drive circuit is stable, and to introduce a contrary voltage change on the buffered output when the voltage source is noisy, with the contrary voltage change being contrary to a voltage change on the voltage source due to noise.

In accordance with a preferred embodiment of the present invention, phase locked loops are provided. A phase locked loop includes a charge pump, a charge pump buffer having an input operatively coupled to an output of the charge pump, and a voltage controlled oscillator having an input operatively coupled to an output of the charge pump buffer and an output operatively coupled to an input of the charge pump. The charge pump buffer includes an input circuit at the input to the charge pump buffer and a drive circuit at the output of the charge pump buffer. The drive circuit includes an input operatively coupled to an output of the input circuit. The voltage level of the output of the drive circuit remains substantially equal to a voltage level of the input of the input circuit when a supply voltage to the charge pump buffer is constant. When a voltage change occurs in the supply voltage, an inversely proportional voltage change occurs in the output of the drive circuit.

In accordance with a preferred embodiment of the present invention, electronic devices are provided. An electronic device according to a preferred embodiment of the present invention includes a digital circuit that is driven by a clock signal from a phase-locked loop. The phase-locked loop includes a voltage controlled oscillator, a phase frequency detector having a first input operatively coupled to a reference clock and a second input operatively coupled to an output of the voltage controlled oscillator, a charge pump operatively coupled to an output of the phase frequency detector and a charge pump buffer operatively coupled to an output of the charge pump and an input of the voltage controlled oscillator. The charge pump buffer is operable to provide a voltage to the voltage controlled oscillator based on a voltage from the charge pump. The voltage to the voltage controlled oscillator tracks the voltage from the charge pump when a voltage supply powering the charge pump buffer and the voltage controlled oscillator is stable. The charge pump buffer is operable to introduce a contrary voltage change on the voltage to the voltage controlled oscillator when the voltage supply is noisy, with the contrary voltage change being contrary to a voltage change on the voltage supply due to noise.

This summary provides only a general outline of apparatuses according to a preferred embodiment of the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION

An apparatus for cancelling supply noise for circuits, such as a phase-locked loop (PLL), is provided, and, in particular a charge pump buffer providing supply noise cancellation for a PLL is provided. A charge pump buffer is provided between a charge pump and a circuit such as a voltage controlled oscillator (VCO). The charge pump buffer acts not only to buffer a signal from the charge pump to the VCO but also to compensate for or cancel noise on the voltage supply that powers the VCO. As the voltage on the supply line increases or decreases due to noise, the output voltage from the charge pump buffer experiences a corresponding and inversely proportional change in voltage. The voltage change on the output of the charge pump buffer is immediate to counteract the effect of supply noise on the VCO and is then gradually removed, allowing the feedback loop in the PLL to take over the task of maintaining a stable output frequency. The supply noise cancellation in the charge pump buffer can be adapted to react much more quickly than the feedback loop through the VCO, avoiding jitter in the frequency of the output clock from the VCO. Although the charge pump buffer with supply noise cancellation disclosed herein is beneficial and applicable to any PLL, it is particularly helpful in low bandwidth PLLS. A low bandwidth PLL has a slow locking rate that makes it more likely to unlock due to supply noise than a high bandwidth PLL. However, a low bandwidth PLL is better able to correct for sideband noise on the reference clock because the low bandwidth naturally trims the sideband noise that falls outside of the bandwidth of the PLL. Thus the low bandwidth PLL is naturally better at handling reference clock noise, and a high bandwidth PLL is better at handling supply noise. The present invention improves supply noise handling in a low bandwidth PLL, providing for noise handling on both the reference clock and the supply. Again though, the charge pump buffer with supply noise cancellation disclosed herein is beneficial and applicable to any PLL or other circuit in which supply noise can be cancelled by an inversely proportional output control voltage.

The term "cancelling" is used herein to refer to an opposition in the output of the charge pump buffer to supply noise, resulting in a reduction in the effect caused by the supply noise in the VCO. The term "cancelling" does not require that the effects of supply noise in the VCO be completely nullified. However, the cancelling of supply noise actively can oppose the affects of supply noise and enables the VCO to better correct for supply noise that might otherwise cause changes or jitter in the frequency of the VCO output.

Figure 1:
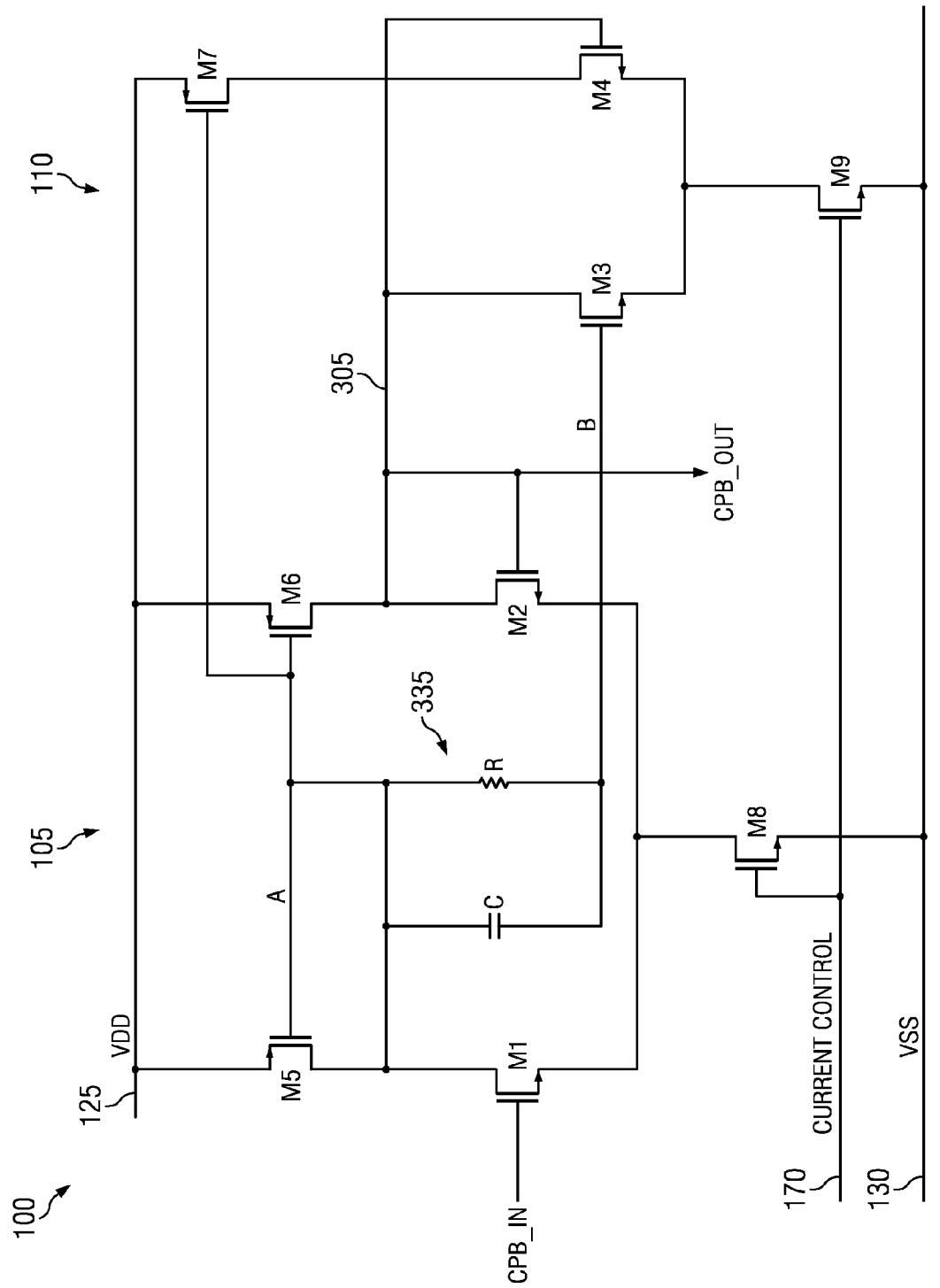
FIG. 1 is a schematic diagram of a charge pump buffer.

Turning now to FIG. 1, a charge pump buffer 100 in accordance with a preferred embodiment of the present invention is described. The circuit configuration of the charge pump buffer 100 will be described first, followed by a description of an exemplary PLL in which the charge pump buffer 100 may be used, followed by a description of the operation of the charge pump buffer 100. The charge pump buffer 100 includes an input circuit 105 and a drive circuit 110. The input circuit 105 receives and buffers an input CPB_IN from a charge pump. The drive circuit 110 generates an output CPB_OUT that may be used by a device such as a VCO in a PLL. The charge pump buffer 100 is powered by a supply voltage VDD 125 and reference voltage VSS 130. The same supply rails 125 and 130 can be used to power the charge pump buffer 100 are also used to power downstream circuitry such as a VCO. The charge pump buffer 100 may compensate for both supply noise on VDD 125 and substrate noise on VSS 130. The charge pump buffer 100 includes a number of switches such as metal oxide semiconductor field-effect transistors (MOSFET) or any other suitable transistors.

The input CPB_IN is received by the input circuit 105 at the gate 135 of an n-channel MOSFET (N-FET) M1. The source of transistor M1 is coupled to the drain of N-FET M8. The source of transistor M8 is coupled to VSS 130. The gate of transistor M8 is coupled to a current control input 170. The current control input 170 can comprise a constant voltage and transistor M8 thus forms a constant current source for the input circuit 105. The drain of transistor M1 is coupled to the drain of a p-channel MOSFET (P-FET) M5. The source of transistor M5 is coupled to VDD 125. The drain of transistor M8 is also coupled to the source of N-FET M2. The gate and source of transistor M2 are coupled to the drain of P-FET M6. The source of transistor M6 is coupled to VDD 125. N-FETS M5 and M6 form a current mirror with the gate and drain of transistor M5 coupled to the gate of transistor M6 220. The gate and drain of transistor M5 and the gate of transistor M6 forms an output node A of the input circuit 105. Additionally, transistors M5, M6, M1, M2, and M8 generally comprise an amplifier, and node A (which is internal to the amplifier) is coupled to filter 335.

The drive circuit 110 has an input node B that is operatively coupled to the output node A. The input node B is received in the drive circuit 110 at the gate of N-FET M3. The source of transistor M3 is coupled to the drain of N-FET transistor M9. The source of transistor M9 is coupled to VSS 130. The gate of transistor M9 is coupled to the current control input 170, and transistor M9 thus forms a constant current source for the drive circuit 110. The drain 265 of transistor M9 is also coupled to the source of N-FET M4. The gate of transistor M4 is coupled to the drain of transistor M3 and to the drains of transistor M2 and M6 220, with this common node or output terminal 305 forming the output CPB_OUT. The drain of transistor M4 is coupled to the drain of P-FET M7. The source of transistor M7 is coupled to VDD 125, and the gate of transistor M7 is coupled to output node A at the gates of transistor M5 and M6.

The input circuit 105 and drive circuit 110 are operatively coupled by a filter 335 coupled between the output node A of the input circuit 105 and the input node B of the drive circuit 110. The filter 335 may comprise any suitable circuit, but, as shown, filter 335 comprises an RC network with a capacitor C coupled in parallel with a resistor R. The input of the RC network is coupled to the output node A of the input circuit 105 and the output of the RC network is coupled to the input node B of the drive circuit 110.

Figure 2:
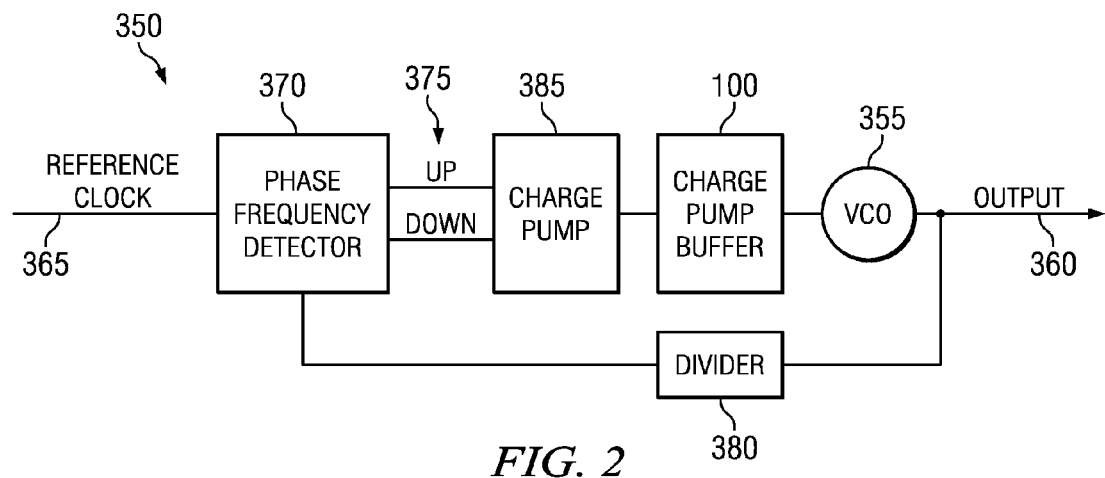
FIG. 2 is a block diagram of a phase locked loop that may include the charge pump buffer of FIG. 1.

Before turning to a description of the operation of the charge pump buffer 100, an exemplary PLL 350 in which the charge pump buffer 100 may be used is illustrated in FIG. 2. The PLL 350 includes a VCO 355 that generates a clock signal 360 based on a reference clock 365. A phase frequency detector 370 compares the reference clock 365 with the VCO clock 360 and produces up/down signals 375 indicating whether the frequency of the VCO clock 360 needs to move up or down to match the frequency of the reference clock 365. The VCO clock 360 may be set at a multiple of the reference clock 365 if desired by including a divider 380 between the output of the VCO 355 and the input of the phase frequency detector 370. The up/down signals 375 drive a charge pump 385 to produce an output voltage that rises to increase the frequency of the VCO 355 and falls to decrease the frequency of the VCO 355. The charge pump buffer 100 is placed between the charge pump 385 and VCO 355 to buffer the VCO control signal from the charge pump 385. The charge pump buffer 100 described herein also varies the output of the charge pump buffer 100 to compensate for supply noise so that the PLL 350 can maintain a lock with the reference clock 365. The PLL 350 may be used to generate a clock signal 360 for any number of electronic devices, including computers, communications equipment, audiovisual equipment, etc.

Turning again to FIG. 1, the operation of the charge pump buffer 100 will now be described. The charge pump buffer 100 drives a device such as a VCO 355 based on the output of a charge pump 385, buffering the output of the charge pump 385 and reducing or preventing kickback from the VCO 355 which might otherwise interfere with the charge pump 385. During a standard tracking mode in the charge pump buffer 100 without supply noise on VDD 125 or VSS 130, the output CPB_OUT tracks the input CPB_IN. Thus, if the input CPB_IN increases, the output CPB_OUT increases, and if the input CPB_IN decreases the output CPB_OUT decreases. Voltage changes due to noise on the VDD 125 or VSS 130 cause immediate inversely proportional voltage changes on the output CPB_OUT. These inversely proportional voltage changes gradually diminish with a time constant selected with consideration of the bandwidth of the PLL. The inversely proportional voltage changes occur immediately with supply noise and gradually diminish as the PLL 350 becomes able to correct for any variations in frequency before substantial jitter or unlocking occurs. This immediate inversely proportional voltage change on the output of the charge pump buffer 100 prevents supply noise, or voltage changes on VDD 125 or VSS 130, from changing the output frequency of the VCO 355. The inversely proportional change in the output CPB_OUT adjusts the time constant of the tank circuit in the VCO 355 to compensate for the change in the supply voltage VDD 125 and VSS 130 used to charge the tank circuit so that the tank circuit continues to charge and discharge in substantially the same amount of time as before the supply noise. This immediate inversely proportional change in the output CPB_OUT gradually diminishes based on the bandwidth or locking rate of the PLL 350, immediately compensating for high frequency noise and allowing the PLL 350 feedback loop then to take over and maintain the frequency lock as it is able. Note that the frequency or slew rate of voltage changes due to noise on the VDD 125 or VSS 130 is typically much higher than the frequency or slew rate of voltage changes on the input CPB_IN and output CPB_OUT of the charge pump buffer 100.

Consider first a scenario in which the VCO 355 is locked to the reference frequency 365 and the input CPB_IN is therefore stable at whatever voltage between VDD 125 and VSS 130 is needed to maintain a lock with a particular reference clock 365. The input CPB_IN from the charge pump 385 varies in a continuous and analog fashion to vary the output frequency of the VCO 355 by varying degrees to maintain the lock with the reference clock 365. However, the capacitors in the charge pump 385 can be large enough that changes in input CPB_IN occur much more slowly than noise on VDD 125. Thus, for the exemplary scenarios here considering the effects of supply noise, the input CPB_IN is taken to be stable at some arbitrary voltage that maintains a lock between the VCO clock 360 and reference clock 365.

Figure 3:
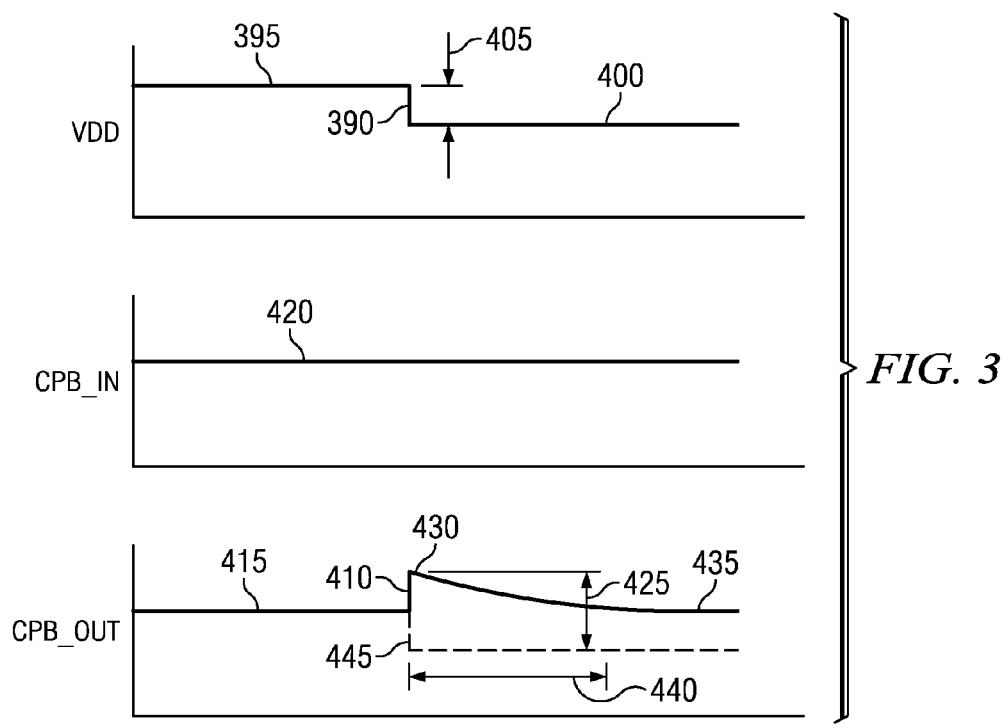
FIG. 3 is a timing diagram illustrating a supply voltage and input and output signals of a charge pump buffer when the input is stable and the supply voltage experiences a voltage drop due to noise.
Figure 4:
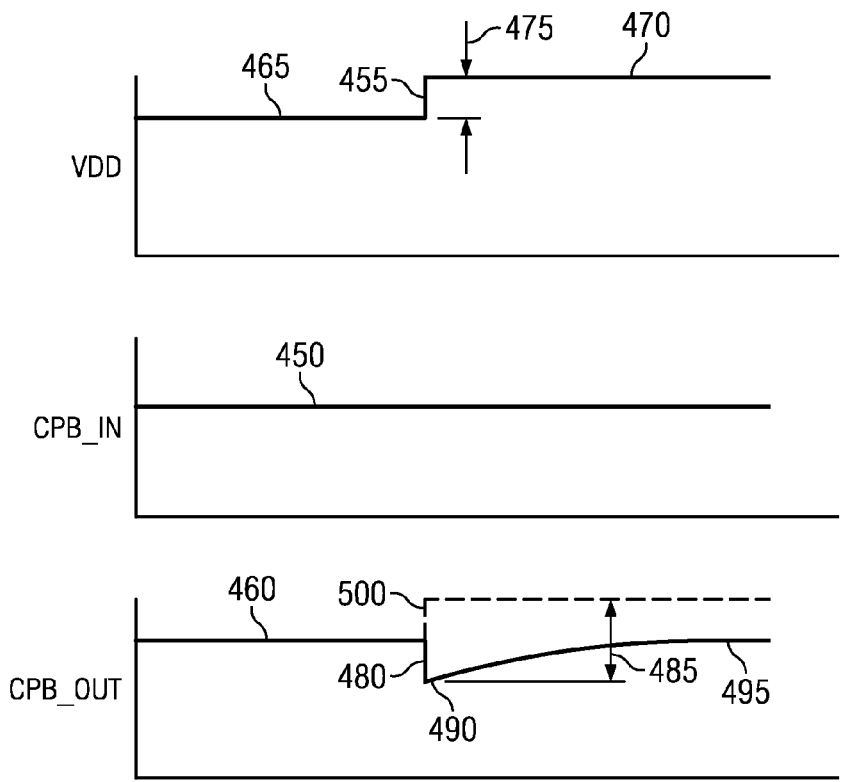
FIG. 4 is a timing diagram illustrating a supply voltage and input and output signals of a charge pump buffer when the input is stable and the supply voltage experiences a voltage increase due to noise.

With the input CPB_IN to the charge pump buffer 100 at a stable and constant voltage with respect to VSS 130 as illustrated in FIG. 3, noise on VDD 125 may cause a high frequency drop 390 from a first voltage 395 to a second voltage 400. Note that note the shape and magnitude of the voltage changes due to noise shown on the timing diagrams of FIGS. 3 and 4 are arbitrary and are shown in idealized form to clarify the operation of the charge pump buffer 100. The timing diagrams do not show the noise slew rates and the ringing effects that may occur on a typical noisy supply line. Furthermore, the timing and speed of the changes in the output CPB_OUT are not specified in the diagrams because they are at least partly dependent on the bandwidth of the PLL. The bandwidth of the charge pump buffer 100 or of the RC network 340 in the charge pump buffer is substantially the same or greater than the bandwidth of the PLL 350. The bandwidth of the PLL 350 can also be defined as the closed-loop gain 3-dB frequency of the PLL.

Initially, the voltage of output node A and the voltage at input node B 245 are equal. When VDD 125 experiences a voltage drop 390 due to noise, output node A tracks the change in VDD 125 and drops by $\Delta V1$ 405, the magnitude of the change in VDD 125 due to noise. The capacitor C tracks the charge at output node A and forces input node B to also immediately drop by $\Delta V1$ 405. When the voltage on input node B at the gate of transistor M3 drops by $\Delta V1$ 405, the current through transistor M3 drops. This steers current from transistor M9 away from transistor M3 and through transistor M4 and transistor M7. The increased current through transistor M7 causes a further drop of $\Delta V2$ on the gate of transistor M7 and on the gate of transistor M6, thus magnifying or adding to the voltage drop already experienced on the gates of transistors M7 and M6 due to the noise on VDD 125. This turns transistor M6 on more strongly and charges the output CPB_OUT higher by an amount proportional to $\Delta V1$ 405 plus $\Delta V2$, working to increase the frequency of the VCO 355 in opposition to the $\Delta V1$ drop on VDD 125 that works to decrease the frequency of the VCO 355. From another point of view, any change in current through transistor M6 is resisted by the steering of current from transistor M3 to transistors M4 and M7, which causes the further drop of $\Delta V2$ on the gate of transistor M7 and on the gate of transistor M6 and working to keep the current through transistor M6 from changing due to the drop in VDD 125. The result is that when VDD 125 drops due to supply noise, the output CPB_OUT experiences an immediate and opposing change in voltage 410 from an initial voltage level 415 that tracked the voltage level 420 on input CPB_IN. The opposing change in voltage 410 has a magnitude 425 that is proportional to the initial voltage drop $\Delta V1$ 405 on VDD 125 (although opposite in direction) plus the additional voltage drop $\Delta V2$ on the gate of transistor M7. The output CPB_OUT immediately peaks at this opposing voltage level 430 and gradually drops back to a standard tracking level 435. In summary, the charge pump buffer 100 introduces a contrary voltage change 410 on the output CPB_OUT when VDD 125 is noisy. Without the noise cancellation provided by the charge pump buffer 100, output CPB_OUT would have a voltage drop 445 that changes substantially as rapidly as the drop 390 on VDD 125 and having a magnitude and direction proportional to the drop 390 on VDD 125. With the noise cancellation provided by the charge pump buffer 100, when VDD 125 drops 390, the output CPB_OUT instead experiences an immediate contrary voltage gain 410 opposing the drop 390. The contrary voltage change 410 on the output CPB_OUT of the charge pump buffer 100 gradually diminishes over time. The VCO 355 is thus able to track the reference clock 365 despite the supply noise.

The rate 440 of the gradual decrease 435 in the opposing voltage on output CPB_OUT is governed by the time constant of the filter 335. This time constant of the filter 335 that determines the bandwidth of the current change on output CPB_OUT can be less than or about equal to the time constant of the charge pump 385. This enables the charge pump buffer 100 to track changes on the input CPB_IN from the charge pump 385. Taken another way, the bandwidth of the charge pump buffer 100 or of the filter 335 can be substantially as great as the bandwidth of the PLL 350. The immediate opposing change in voltage 410 on output CPB_OUT prevents jitter in the output frequency of the VCO 355 due to noise that the PLL 350 might not otherwise be able to immediately correct for, and the gradual decrease 435 in the opposing change in voltage on output CPB_OUT allows the feedback loop of the PLL 350 to take over frequency tracking as it is able. The bandwidth of the charge pump buffer 100 is, thus, selected based on the bandwidth of the PLL 350, or more particularly, the bandwidth of the charge pump 385 in the PLL 350.

The relative size of the transistors (e.g., M6, M7, etc.) can be selected to set a desired proportion between voltage changes (e.g., 390) on the supply lines 125 and 130 due to supply noise and the inversely proportional voltage changes (e.g., 410) on the output CPB_OUT. For example, if a greater opposing change (e.g., 410) is needed in output CPB_OUT for a given change (e.g., 390) in VDD 125 to maintain the same frequency on the VCO clock 360 in a particular PLL 350, the transistors may be sized so that the changing gate voltage of transistor M7 and consequently transistor M6 causes a larger change (e.g., 410) in output CPB_OUT than the voltage change (e.g., 390) on VDD 125.

Note that the inversely proportional voltage change 410 on output CPB_OUT is not necessarily exactly opposite in magnitude to the voltage change 390 on VDD 125. Rather, the voltage change 410 on output CPB_OUT can be adapted to substantially counteract the effects of the voltage change 390 on VDD 125 on downstream components. In the case of a downstream VCO 355 with an LC tank, the voltage change 410 on output CPB_OUT is scaled to adjust the time constant of the LC tank so that the charge and discharge time of the LC tank remains constant despite the changed charging voltage 390 from the supply rails VDD 125 and VSS 130 due to noise.

If a typical buffer were used in place of the charge pump buffer 100, a drop in VDD 125 due to supply noise might actually cause a drop in the buffer output despite a constant input from the charge pump 385. Thus, a typical buffer in which the output would drop with a drop in VDD or rise with a rise in VDD would exacerbate frequency drift in the VCO 355 in an additive fashion with the direct affect of the VDD noise on the VCO 355. Simply stabilizing the output of a typical buffer, while helpful, would not counteract the affect VDD noise has downstream in the PLL 350 on the VCO 355. In contrast, the charge pump buffer 100 actively compensates or negates the affects that supply noise on VDD 125 or VSS 130 has on downstream components such as the VCO 355 by generating a contrary voltage change on output CPB_OUT for a given voltage change on VDD 125 or VSS 130.

Turning now to FIG. 4, a scenario will be discussed in which input CPB_IN is in a typical stable tracking state 450 and VDD 125 experiences a sudden increase 455 in voltage due to noise. Again, changes on VDD 125 due to noise and the corresponding changes in the output CPB_OUT of the drive circuit 110 are shown in idealized fashion in the drawings to simplify and clarify the explanation of the charge pump buffer 100. Thus, the slew rates, ringing effects and continuous changes that might naturally occur on VDD 125 due to supply noise are not shown. However, the behavior of the charge pump buffer 100 does not change dependent on the actual voltage profile of VDD 125 and the description of the charge pump buffer 100 provided herein is equally applicable to real world supply noise as to the idealized version shown in the drawings.

Initially, the output CPB_OUT of the charge pump buffer 100 is at a stable voltage level 460, tracking the stable voltage level 450 on the input CPB_IN. As with the illustrations of supply noise, the voltage levels on the input CPB_IN and the output CPB_OUT of the charge pump buffer 100 during the stable tracking state are also shown in idealized fashion, and the normal gradual and slight variations that would take place on the input CPB_IN and the output CPB_OUT to lock the VCO clock 360 to the reference clock 365 are not shown. Again, however, the behavior of the charge pump buffer 100 does not change dependent on the actual voltage profile of the input CPB_IN and the output CPB_OUT and the description of the charge pump buffer 100 provided herein is equally applicable to real world voltage levels on the input CPB_IN and the output CPB_OUT as to the idealized version shown in the drawings.

Supply noise may a sudden voltage jump 455 on VDD 125 from an initial level 465 to another level 470. Initially, the voltage of output node A and the voltage at input node B are equal. When VDD 125 experiences a voltage gain 455 due to noise, output node A tracks the change in VDD 125 and jumps by $\Delta V1$ 475, the magnitude of the change in VDD 125 due to noise. (The voltage at output node A will be almost at the same voltage level as VDD 125, minus the small gate to source voltage Vgs of transistors M5 and M6.) The capacitor C tracks the charge at output node A and forces input node B to also immediately jump by $\Delta V1$ 475. When the voltage on input node B at the gate of transistor M3 jumps by $\Delta V1$ 475, the current through transistor M3 increases. This steers current from transistor M9 away from transistors M4 and M7 and through transistors M3 and M6. The decreased current through transistor M7 causes an further increase of $\Delta V2$ on the gate of transistor M7 and on the gate of transistor M6, thus magnifying or adding to the voltage gain already experienced on the gates of transistor M7 and M6 due to the noise on VDD 125. This shuts transistor M6 down more and reduces the voltage of CPB_OUT by an amount proportional to $\Delta V1$ 475 plus $\Delta V2$, working to decrease the frequency of the VCO 355 in opposition to the $\Delta V1$ jump on VDD 125 that works to increase the frequency of the VCO 355. From another point of view, any change in current through transistor M6 is resisted or opposed by the steering of current from transistors M4 and M7 to transistor M3, which causes the further gain of $\Delta V2$ on the gate of transistor M7 and on the gate of transistor M6 and working to keep the current through transistor M6 from changing due to the gain in VDD 125. The result is that when VDD 125 jumps due to supply noise, the output CPB_OUT experiences an immediate and opposing change in voltage 480 from an initial voltage level 460 that tracked the voltage level 450 on input CPB_IN. The opposing change in voltage 480 has a magnitude 485 that is proportional to the initial voltage gain $\Delta V1$ 475 on VDD 125 (although opposite in direction) plus the additional voltage gain $\Delta V2$ on the gate 330 of M7 320. The output CPB_OUT immediately drops by this opposing voltage level 490 and gradually rises back to a standard tracking level 495. In summary, the charge pump buffer 100 introduces a contrary voltage change 480 on the output CPB_OUT when VDD 125 is noisy. Without the noise cancellation provided by the charge pump buffer 100, output CPB_OUT would have a voltage gain 500 that changes substantially as rapidly as the gain 455 on VDD 125 and having a magnitude and direction proportional to the gain 455 on VDD 125. With the noise cancellation provided by the charge pump buffer 100, when VDD 125 jumps 455, the output CPB_OUT instead experiences an immediate contrary voltage drop 480 opposing the gain 455. The contrary voltage change 480 on the output CPB_OUT of the charge pump buffer 100 gradually diminishes over time. The VCO 355 is thus able to track the reference clock 365 despite the supply noise.

Figure 5:
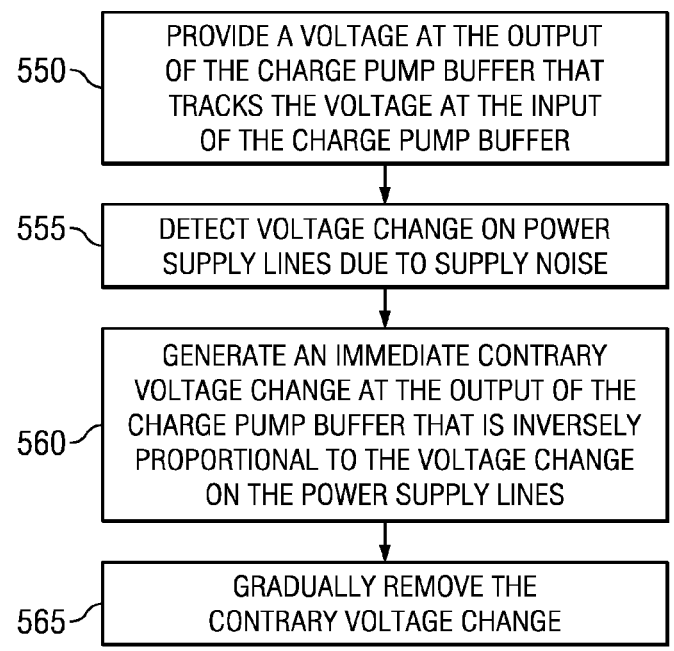
FIG. 5 is a flow chart of an exemplary method for cancelling supply noise in a PLL.

Turning now to FIG. 5, a method for cancelling supply noise in a phase locked loop will be described. A voltage is provided at the output of the charge pump buffer that tracks the voltage at the input of the charge pump buffer (box 550). When used in a PLL, the voltage at the input of the charge pump buffer is gradually varied as needed to adjust the frequency from a VCO at the output of the charge pump buffer in order to maintain a lock with a reference frequency. When supply noise causes a voltage change on the power supply lines (box 555) that power the charge pump buffer and the VCO, a contrary voltage change is immediately generated at the output of the charge pump buffer (box 560). The contrary voltage change at the output of the charge pump buffer is inversely proportional to the voltage change on the power supply lines. The contrary voltage charge is then gradually removed (box 565). The speed at which the contrary voltage charge is removed is based on the bandwidth of the PLL, enabling the PLL to track the reference frequency as the compensation for supply noise is removed.

In summary, a voltage change due to noise causes an immediate contrary change in the output voltage. This contrary change in the output voltage is used in a feedback loop that further increases the contrary or opposing change in the output voltage, thereby negating the downstream affects of the voltage change on the power supply rails (e.g., VDD 125 and VSS 130) due to supply noise. Turning again to FIG. 1, as output node A has a voltage change due to supply noise, input node B has an immediate corresponding change in voltage. This causes an immediate inverse change in voltage at common node 305 and output CPB_OUT. For example, if the voltage drops at input node B, transistor M3 conducts less current and common node 305 is more strongly pulled up to VDD 125 through transistor M6. If the voltage rises at input node B, transistor M3 conducts more current and common node 305 is more strongly pulled down to VSS 130 through transistor M3. Thus, a voltage change on VDD 125 due to noise causes an immediate contrary change in the output voltage at output CPB_OUT. This contrary change is also used in a feedback that further increases the contrary change in the output voltage. The feedback loop includes the current steering in the drive circuit 110 and feedback from the gate of transistor M7 to the gate of transistor M6. As current from transistor M9 shifts between transistors M3 and M4 based on the change in voltage at the gate of transistor M3, the current change through transistor M7 320 causes a directly proportional change in voltage at the gate of transistor M7. This feedback causes a voltage change on the gate of transistor M6 that is directly proportional to a voltage change on input node B. For example, if the voltage drops on input node B, current is steered away from transistor M3 and through transistor M7, dropping the voltage on the gate of transistor M7 and the gate of transistor M6. If the voltage rises on input node B, current is steered to transistor M3 and away from transistor M7, raising the voltage on the gate of transistor M7 and the gate of transistor M6. This feedback reinforces the voltage change on the output CPB_OUT. As the voltage at output node A drops due to noise, the voltage at output CPB_OUT is directly increased by the reduced conductivity through transistor M3 and further increased by the increased current through transistor M7 that drops the gate voltage of transistor M6, increasing the current through transistor M6. As the voltage at VDD 125 drops, the voltage at the gates of transistors M3 and M6 220 also drops. This decreases the current through the NMOS transistor M3 and increases the current through PMOS transistor M6, isolating output CPB_OUT from VSS 130 and coupling it more strongly to VDD 125 and thereby increasing the voltage of output CPB_OUT contrary to the drop on VDD 125. As the voltage at VDD 125 rises, the voltage at the gates of transistors M3 and M6 also rises. This increases the current through the NMOS transistor M3 255 and decreases the current through PMOS transistor M6, isolating output CPB_OUT from VDD 125 and coupling it more strongly to VSS 130 and thereby decreasing the voltage of output CPB_OUT contrary to the rise on VDD 125, both directly and indirectly through a feedback loop.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

What is claimed is:

1. An apparatus for cancelling supply noise, the apparatus comprising:
   an input circuit including:
      an amplifier having an internal node, a first input terminal, a second input terminal, and an output terminal, wherein the first input terminal receives an input from a charge pump; and
      a filter that is coupled to the internal node; and
   a drive circuit coupled to an output terminal of the amplifier of the input circuit and to the filter, wherein the drive circuit introduces a contrary voltage change to an output at the output terminal when a voltage source powering the input circuit and the drive circuit is noisy such that the contrary voltage change is contrary to a voltage change on the voltage source due to noise,
   wherein the driver circuit further comprises:
      a P-FET that is coupled to the internal node at its gate;
      a first N-FET that is coupled to the filter at its gate and to the output node at its drain;
      a second N-FET that is coupled to the drain of the P-FET at its drain and that is coupled to the output node at its gate; and
      a third N-FET that is coupled to the sources of the first and second N-FETs at its drain
   wherein the filter further comprises:
      a resistor that is coupled between the internal node and the gate of the first N-FET; and
      a capacitor that is coupled in parallel to the resistor.

2. The apparatus of claim 1, wherein a time constant of the filter is at least as fast as a time constant of the charge pump.

3. The apparatus of claim 1, wherein when the input from the charge pump changes state, the filter has substantially no effect on the output of the drive circuit.

4. The apparatus of claim 1, wherein the contrary voltage change occurs substantially immediately after the voltage change on the voltage source and wherein the contrary voltage change is gradually removed from the output.

5. The apparatus of claim 1, the input circuit comprising a constant current source that supplies a shared current to a pair of transistor stacks.

6. The apparatus of claim 5, further comprising a feedback loop in the drive circuit that increases the contrary voltage change on the output.

7. A phase-locked loop (PLL) comprising:
a charge pump;
a charge pump buffer including:
an amplifier having an internal node, a first input terminal, a second input terminal, and an output terminal, wherein the first input terminal is coupled to an output of the charge pump; and
a filter that is coupled to the internal node; and
a drive circuit coupled to an output terminal of the amplifier of the input circuit and to the filter, wherein the drive circuit introduces a contrary voltage change to an output at the output terminal when a voltage source powering the amplifier and the drive circuit is noisy such that the contrary voltage change is contrary to a voltage change on the voltage source due to noise; and
a voltage controlled oscillator (VCO) having an input coupled to the amplifier and drive circuit of the charge pump buffer and an output coupled to an input of the charge pump,
wherein the driver circuit further comprises:
a P-FET that is coupled to the internal node at its gate;
a first N-FET that is coupled to the filter at its gate and to the output node at its drain;
a second N-FET that is coupled to the drain of the P-FET at its drain and that is coupled to the output node at its gate; and
a third N-FET that is coupled to the sources of the first and second N-FETs at its drain
wherein the filter further comprises:
a resistor that is coupled between the internal node and the gate of the first N-FET; and
a capacitor that is coupled in parallel to the resistor.

8. The PLL of claim 7, wherein a time constant of the filter is not substantially greater than a time constant of the charge pump.

9. The PLL of claim 7, wherein a bandwidth of the filter is at least as great as a bandwidth of the phase-locked loop.

10. The PLL of claim 7, wherein when the input from the charge pump changes state due to feedback from the VCO, the filter has substantially no effect on the output of the charge pump buffer.

11. The PLL of claim 7, wherein the inversely proportional voltage change occurs substantially immediately after the voltage change on the voltage source and wherein the inversely proportional voltage change is gradually removed from the output.

12. The PLL of claim 7, further comprising a feedback loop in the drive circuit that increases the inversely proportional voltage change on the output.

13. A PLL comprising:
a VCO;
a divider that is coupled to the VCO;
a phase/frequency detector that is coupled to the divider and that receives an input signal;
a charge pump that is coupled to the phase/frequency detector;
a charge buffer including:
an amplifier having an internal node, a first input terminal, a second input terminal, and an output terminal, wherein the first input terminal is coupled to the charge pump, and wherein the output terminal is coupled to the second input terminal, and wherein the output terminal is coupled to the VCO;
a filter that is coupled to the internal node; and
a driver circuit that is coupled to the output node and to the filter, wherein driver applies an adjustment voltage to the output node when a voltage source powering the amplifier and the drive circuit is noisy such that the adjustment voltage is contrary to a voltage change on the voltage source due to noise,
wherein the driver circuit further comprises:
a P-FET that is coupled to the internal node at its gate;
a first N-FET that is coupled to the filter at its gate and to the output node at its drain;
a second N-FET that is coupled to the drain of the P-FET at its drain and that is coupled to the output node at its gate; and
a third N-FET that is coupled to the sources of the first and second N-FETs at its drain. wherein the filter further comprises:
a resistor that is coupled between the internal node and the gate of the first N-FET; and
a capacitor that is coupled in parallel to the resistor.

14. The PLL of claim 13, wherein the amplifier further comprises:
a second P-FET that is diode-connected and that is coupled to the internal node at its gate;
a third P-FET that is coupled to the internal node at its gate;
a fourth N-FET that is coupled to the drain of the second P-FET at its drain and that is coupled to the charge pump at its gate;
a fifth N-FET that is coupled to the drain of the third P-FET at its drain and that is coupled to the drain of the third P-FET at its gate; and
a sixth N-FET that is coupled to the sources of the fourth and fifth N-FETs at its drain.

* * * * *